(12) United States Patent
Boeke

(10) Patent No.: US 11,356,041 B2
(45) Date of Patent: Jun. 7, 2022

(54) MOTOR STARTER AND METHOD FOR STARTING AN ELECTRIC MOTOR

(71) Applicant: Siemens Aktiengesellschaft, Munich (DE)

(72) Inventor: Willi Boeke, Lauf (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 42 days.

(21) Appl. No.: 16/910,686

(22) Filed: Jun. 24, 2020

(65) Prior Publication Data

US 2020/0412282 A1 Dec. 31, 2020

(30) Foreign Application Priority Data

Jun. 25, 2019 (EP) ..................... 19182235

(51) Int. Cl.
*H02P 1/04* (2006.01)
*G01R 19/165* (2006.01)
*H01L 29/74* (2006.01)
*H02P 1/30* (2006.01)
*H02P 23/14* (2006.01)
*H02P 29/024* (2016.01)

(52) U.S. Cl.
CPC .......... *H02P 1/04* (2013.01); *G01R 19/16528* (2013.01); *H01L 29/74* (2013.01); *H02P 1/30* (2013.01); *H02P 23/14* (2013.01); *H02P 29/027* (2013.01)

(58) Field of Classification Search
CPC .. H02P 29/027; H02P 1/04; H02P 1/30; H02P 23/14; H01L 29/74
See application file for complete search history.

(56) References Cited

U.S. PATENT DOCUMENTS

| | | | | |
|---|---|---|---|---|
| 5,008,608 A | * | 4/1991 | Unsworth | H02P 27/02 318/729 |
| 5,159,657 A | * | 10/1992 | Runggaldier | H02M 1/0845 318/812 |
| 5,565,753 A | * | 10/1996 | Chen | H02P 27/02 318/809 |
| 6,420,848 B1 | | 7/2002 | Gritter et al. | |
| 6,870,333 B2 | * | 3/2005 | Griepentrog | H02P 27/18 318/257 |
| 7,023,166 B1 | * | 4/2006 | Kohen | H02P 21/12 318/727 |

(Continued)

FOREIGN PATENT DOCUMENTS

DE 9204107 U1 6/1992
EP 2192685 A1 6/2010

OTHER PUBLICATIONS

European Search Report for European Patent Application No. 19182235 dated Dec. 17, 2019.

*Primary Examiner* — Rina I Duda

(74) *Attorney, Agent, or Firm* — Harness, Dickey & Pierce, P.L.C

(57) ABSTRACT

A motor starter and a method for starting an electric motor are disclosed. In an embodiment, the motor starter includes a phase gating unit and a control unit. The phase gating unit is configured to be deactivated via the control unit after an activity period of the phase gating unit has elapsed and is configured to be deactivated during operation after the activity period has elapsed.

20 Claims, 3 Drawing Sheets

(56) References Cited

U.S. PATENT DOCUMENTS

| | | | | |
|---|---|---|---|---|
| 8,179,082 B2* | 5/2012 | Li | ............................. | H02P 1/30 |
| | | | | 318/778 |
| 8,853,992 B2* | 10/2014 | Boom | ..................... | B66B 25/00 |
| | | | | 318/812 |
| 9,160,257 B2* | 10/2015 | Hua | .......................... | H02P 1/26 |
| 9,685,898 B2* | 6/2017 | Wei | .......................... | H02P 1/16 |
| 2013/0300339 A1* | 11/2013 | Boom | ..................... | B66B 25/00 |
| | | | | 318/812 |
| 2015/0349673 A1* | 12/2015 | Wu | ........................ | H02P 6/182 |
| | | | | 318/779 |

\* cited by examiner

MOTOR STARTER AND METHOD FOR STARTING AN ELECTRIC MOTOR

PRIORITY STATEMENT

The present application hereby claims priority under 35 U.S.C. § 119 to European patent application number EP 19182235.2 filed Jun. 25, 2019, the entire contents of which are hereby incorporated herein by reference.

FIELD

Embodiments of the invention generally relate to a motor starter and to a method for starting a motor, specifically to a method for starting an electric motor.

BACKGROUND

A distinction has to be drawn between two embodiments with respect to the term motor starter: one form of a motor starter is known as a so-called soft starter. Another form is known as a so-called hybrid motor starter.

Soft starters are active throughout operation of an electric motor and reduce the effective values of the feeding current and the feeding voltage by way of phase gating during a switch-on process. Maximum phase gating is active when the motor is switched on. During start-up of the motor, phase gating is gradually reduced until the full supply system voltage is reached. Phase gating is no longer active after run-up of the motor and the motor is operated at the rated current.

Hybrid motor starters comprise a combination of two switching technologies (electronically via semiconductors, in particular thyristors or triacs, and electromechanically by contact) and are active throughout operation of an electric motor, but connect the motor to the supply system without reducing the voltage (that is to say without phase gating).

Furthermore, motor circuit breakers, motor protective relays and a star-delta circuit are known per se. Motor circuit breakers, motor protective relays or a star-delta start-up circuit comprise or are protective circuits which respond to high currents when an electric motor is switched on or are intended to ensure start-up of the electric motor with reduced power consumption.

When modern motors, in particular three-phase asynchronous machines of energy efficiency class IE3 or IE4, are switched on by motor starters, for example a motor starter with a motor circuit breaker or a contactor with an additional motor circuit breaker, a very high inrush current (inrush) which can trigger corresponding protective functions in the motor branch is produced. For example, overload protection of the motor or short-circuit protection can be activated by a high inrush current in the case of a motor circuit breaker, and the short-circuit protection mechanism can be triggered by a high inrush current in the case of a circuit breaker.

In the past, effects of this kind occurred quite rarely. On account of the increased use of modern energy-efficient motors, it is assumed that faults of this kind will increase.

Limiting an inrush current when switching on an electric motor is known per se. In the case of three-phase asynchronous motors, the inrush current can be effectively limited via a so-called soft starter. Here, the effective voltage across the motor terminals is reduced and therefore also the inrush and start-up current are limited by phase gating via thyristors in the main electrical circuit. Soft starters are already required for motors starting from a power of approximately 5.5 kW by the energy suppliers for protection of the power supply systems against dips in voltage and are successfully used for this purpose. For use in relatively small motors with a power of below 5.5 kW, a soft starter is not required and is also not economical just for limiting the inrush current. Soft starters are used only when soft starting of the entire drive is additionally paramount.

SUMMARY

At least one embodiment of the invention proposed here is directed to specifying a motor starter which is compact and economical and is also suitable, for example, for use in electric motors with a power of less than approximately 5.5 kW. At least one embodiment of the invention proposed here is directed to specifying a method for operating a motor starter of this kind.

Embodiments of the invention are directed to a motor starter and a method for starting an electric motor having the features of the respective independent claims.

To this end, at least one embodiment of the invention is directed to a motor starter which is intended for starting an electric motor: the motor starter comprises a phase gating unit, in particular a phase gating unit which is known per se in principle, and a control unit. The phase gating unit can be deactivated via the control unit after a prespecified or prespecifiable activity period of the phase gating unit has elapsed. The control unit is therefore designed and intended to deactivate the phase gating unit after the prespecified or prespecifiable activity period has elapsed.

In a corresponding method for operating a motor starter of at least one embodiment, the control unit deactivates the phase gating unit after the prespecified or prespecifiable activity period of the phase gating unit has elapsed.

At least one embodiment of the invention proposed here is directed to a system comprising at least one transportation device which can be driven by way of an electric motor, wherein the electric motor can be switched on via a motor starter according to at least one embodiment of the invention and/or is switched on by way of a method according to at least one embodiment of the invention.

At least one embodiment of the invention proposed here is directed to a motor starter for starting an electric motor, comprising:

phase gating unit; and a control unit, to deactivate the phase gating unit after elapse of an activity period of the phase gating unit, the activity period of the phase gating unit corresponding to an integer or rational multiple of half-cycles or full cycles of a supply system frequency, and the activity period not exceeding a duration of four full cycles of the supply system frequency.

At least one embodiment of the invention proposed here is directed to a method for operating a motor starter including a phase gating unit and a control unit, the method comprising:

deactivating, via the control unit, the phase gating unit after elapse of an activity period of the phase gating unit, the activity period of the phase gating unit corresponding to an integer or rational multiple of half-cycles or full cycles of a supply system frequency, and the activity period not exceeding a duration of four full-cycles of the supply system frequency.

At least one embodiment of the invention proposed here is directed to a system, comprising:

at least one transportation device, configured to be driven via an electric motor, the electric motor being configured to be switched on via a motor starter including phase gating unit, and a control unit, to deactivate the phase gating unit after elapse of an activity period of the phase gating unit, the activity period of the phase gating unit corresponding to an integer or rational multiple of half-cycles or full cycles of a supply system frequency, and the activity period not exceeding a duration of four full cycles of the supply system frequency.

BRIEF DESCRIPTION OF THE DRAWINGS

An example embodiment of the invention will be explained in more detail below with reference to the drawing. Objects or elements which correspond to one another are provided with the same reference signs throughout the figures.

The example embodiment should not be understood as meaning a restriction of the invention. Rather, additions and modifications are also entirely possible within the scope of the present disclosure, in particular those which can be gathered by a person skilled in the art with regard to achieving the object, for example by combining or modifying individual features or method steps described in connection with the general or specific part of the description and contained in the claims and/or the drawing, and which result in new subject matter or in new method steps or sequences of method steps by virtue of features which can be combined.

In the drawing,

Figure 1:
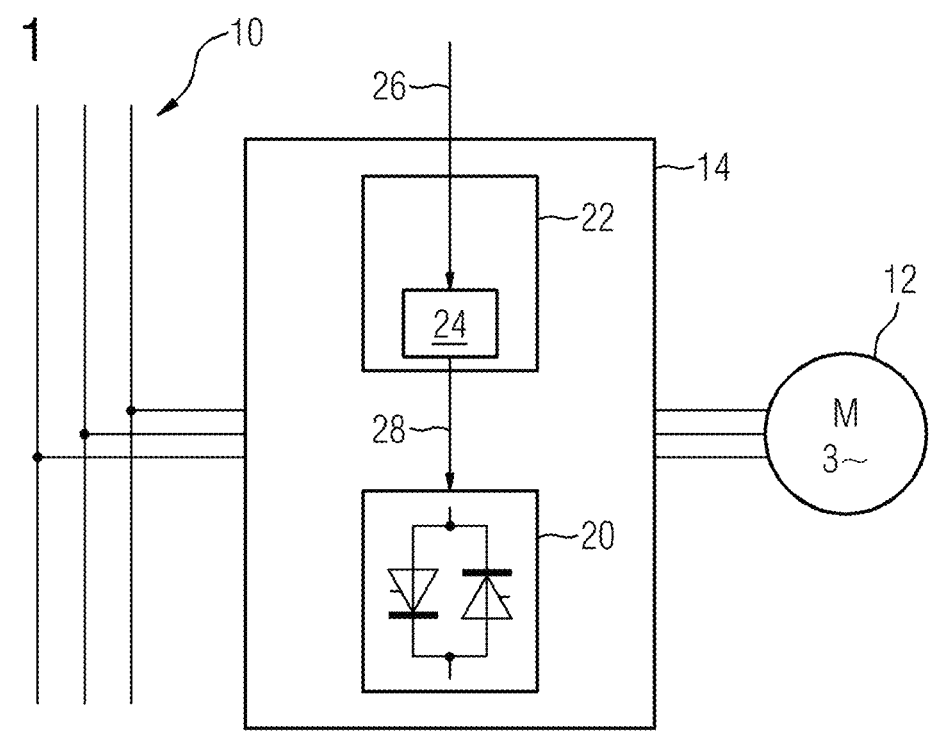
Figure 2:
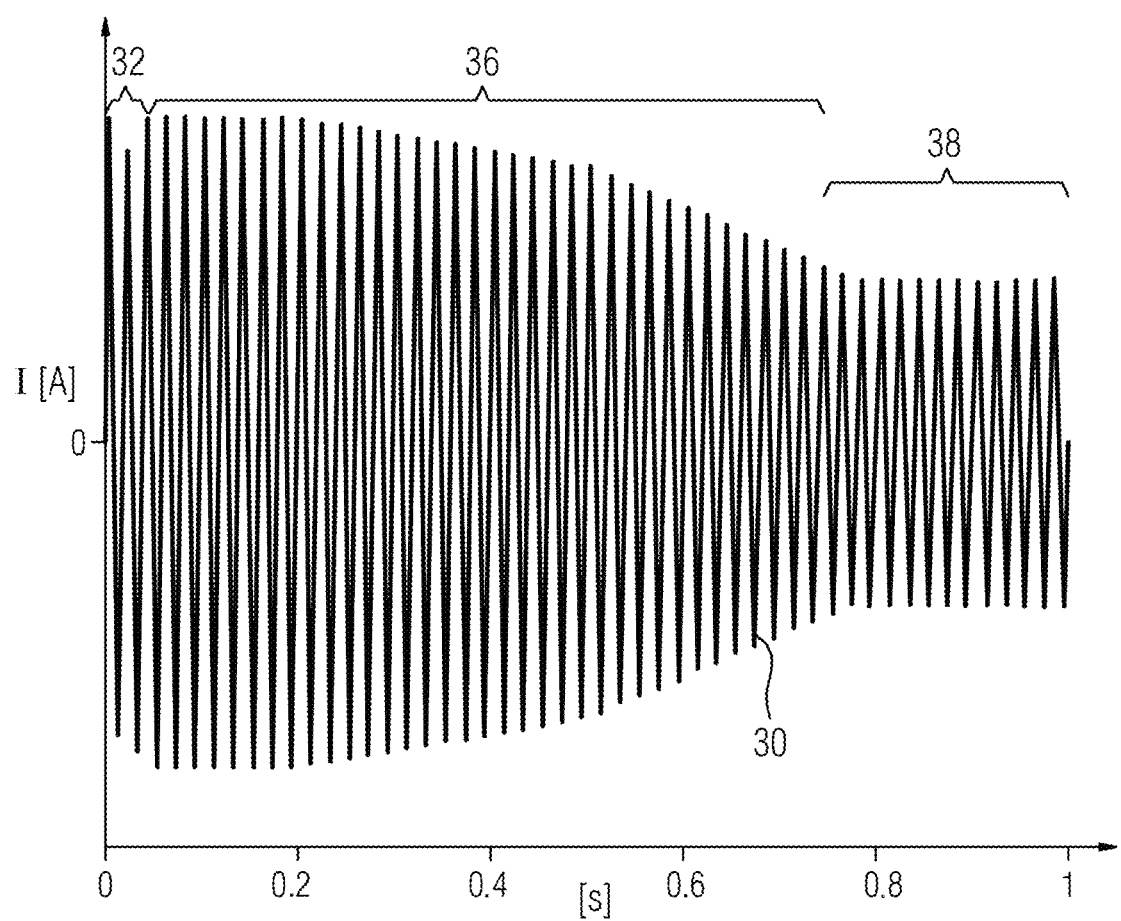
Figure 3:
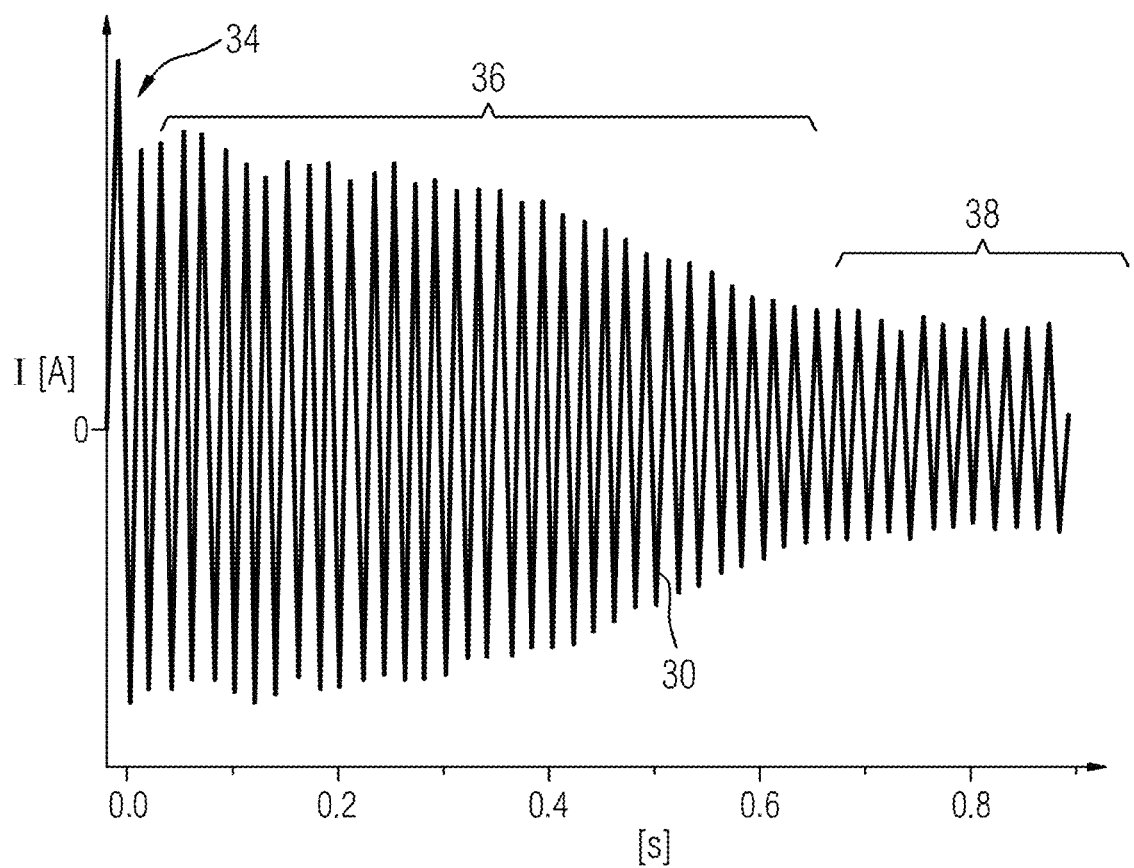
Figure 4:
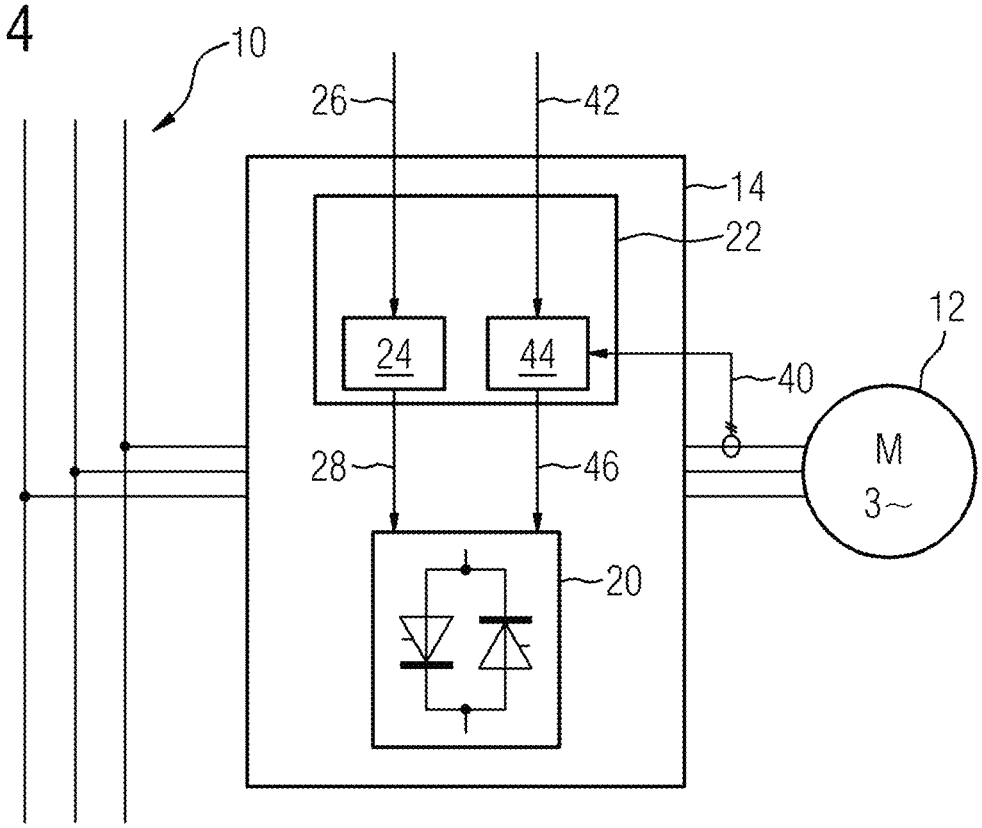
Figure 5:
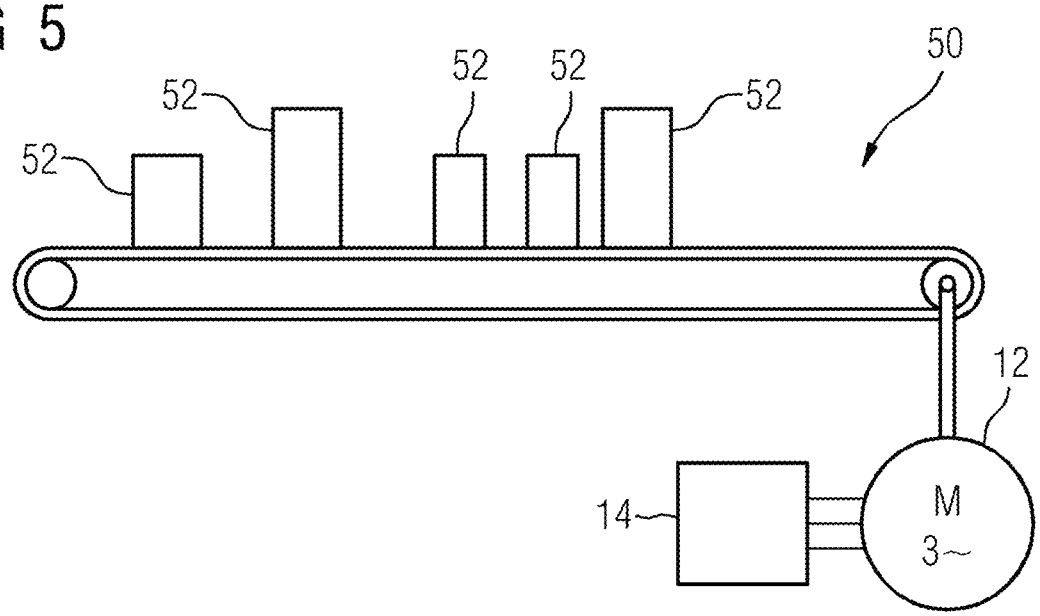

FIG. 1 shows an electric motor which is connected to an electrical supply system and comprises a motor starter, FIG. 2 and FIG. 3 show a current profile when an electric motor is switched on, once with and once without the soft start-up resulting according to the approach proposed here, FIG. 4 shows an optional embodiment of a motor starter, and FIG. 5 shows an example application scenario for an electric motor which can be switched on via a motor starter according to the approach proposed here or which is switched on during operation.

DETAILED DESCRIPTION OF EXAMPLE EMBODIMENTS

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one embodiment of the invention relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

To this end, at least one embodiment of the invention is directed to a motor starter which is intended for starting an electric motor: the motor starter comprises a phase gating unit, in particular a phase gating unit which is known per se in principle, and a control unit. The phase gating unit can be deactivated via the control unit after a prespecified or prespecifiable activity period of the phase gating unit has elapsed. The control unit is therefore designed and intended to deactivate the phase gating unit after the prespecified or prespecifiable activity period has elapsed. In a corresponding method for operating a motor starter of this kind, the control unit deactivates the phase gating unit after the prespecified or prespecifiable activity period of the phase gating unit has elapsed.

At least one embodiment of the invention proposed here is directed to a system comprising at least one transportation device which can be driven by way of an electric motor, wherein the electric motor can be switched on via a motor starter according to at least one embodiment of the invention and/or is switched on by way of a method according to at least one embodiment of the invention.

Since phase gating is active only for a limited time in accordance with the approach proposed here—unlike in the case of a soft starter—, the phase gating unit, that is to say for example its thyristors or the like, also carries current only for a limited time. Heat is produced only during this time. The heat produced is only very low in comparison to the heat to be dissipated in the case of a so-called soft starter. Heat sinks for discharging heat or the like are therefore not required. This provides a possibility for very compact design of the motor starter proposed here. Furthermore, switching elements, that is to say for example thyristors, triacs or the like, which are designed for the short operating period for each switch-on process in respect of their current-carrying capacity are used for the phase gating unit, and accordingly switching elements which cost less and have smaller dimensions can be used than are required in the case of soft starters and are active there throughout the switch-on process. This provides a possibility for economical design of the motor starter proposed here.

At least one embodiment of the invention is based on the knowledge that motor starters or consumer branches (combinations of contactors and protection devices) which do not contain a soft-starter functionality/device can be protected against undesired response of the respective protective functions only by corresponding overdimensioning. In the case of a motor circuit breaker, this occurs, for example, by correspondingly low utilization of the motor circuit breaker. The short-circuit triggering value is, for example, approximately 13 times the device rated current and the integrated overload protection can be set in a range of approximately 65% to 100% of the device rated current. If the motor circuit breaker is selected such that the motor rated current corresponds to the lower setting for the circuit breaker, start-up of the motor with almost 19 times the rated current of the motor is possible, without the protective function of the motor circuit breaker responding. If motor starters which permit only at most 8 times the motor rated current as the maximum value on account of their design and are equipped with a corresponding protective function are used, overdimensioning is likewise necessary.

Overdimensioning of this kind is no longer necessary with the invention proposed here. The motor starters can, as before, be designed and tested in accordance with the product standard. Realizing only brief activation of phase gating is possible in a relatively simple manner. The components required for this purpose, such as thyristors or triacs with corresponding driving are already present in soft starters which are known per se.

The use of electric motors with high inrush currents is not a problem with the invention proposed here. Erroneous project design is avoided. Motor starters corresponding to the approach proposed here are more energy efficient, because the phase gating only lasts a short time. Moreover, project design is less complex since the inrush currents no longer need to be taken into account when designing the motor starter.

Owing to the reduction in the inrush current (inrush) achieved, all loads and transmissions driven by the respective electric motor, clutches and belt drives are also protected by a reduced breakaway peak torque. Therefore, the service life of the entire drive train is increased.

The period of activity of the phase gating unit can be prespecified, for example, as the duration of precisely one half-cycle of the supply system frequency of the feeding supply system (the duration of only the first half-cycle of the supply system frequency after switch-on). The period of activity of the phase gating unit can alternatively be prespecified as the duration of precisely one, two, three, four etc. full cycles of the supply system frequency of the feeding supply system. In a further refinement, the period of activity of the phase gating unit can be prespecified as arbitrary intermediate values, for example as the duration of 0.5 full cycles, 0.6 full cycles, 1.25 full cycles etc. of the supply system frequency of the feeding supply system.

The claims relate to advantageous refinements of the invention. Dependency references which are used in this case within the claims refer to the further embodiment of the subject matter of the claim referred to by way of the features of the respective dependent claim. They should not be understood as dispensing with the attainment of independent substantive protection for the features or combinations of features of a dependent claim. Furthermore, with regard to interpreting the claims and the description in the case of more specific concretization of a feature in a dependent claim, it should be assumed that such a restriction is not present in the respective preceding claims and a more general embodiment of the substantive motor starter or of the method for operating the motor starter. Any reference in the description to aspects of dependent claims should therefore be read expressly as a description of optional features even without a specific indication. Finally, it should be pointed out that the method specified here can also be developed in accordance with the dependent apparatus claims and vice versa, for example by way of the motor starter comprising means for executing individual steps or several steps of the method or the method comprising steps which can be executed by way of apparatuses comprised by the motor starter.

In one embodiment of the motor starter proposed here or of a method for operating the motor starter, the control unit comprises a counter which can be initialized with an initialization value which codes the activity period of the phase gating unit and is initialized with an initialization value of this kind during operation of the motor starter. Automatic deactivation of the phase gating unit after the electric motor has been switched on and after the respectively prespecified or prespecifiable activity period has elapsed takes place by way of the phase gating unit being deactivated by way of a or on account of a deactivation signal which is generated when the counter has run down. To this end, the control unit of the motor starter, in particular its counter, is intended and designed to generate a deactivation signal when the counter has run down, and the motor starter is intended and designed overall for the phase gating unit to be able to be deactivated by way of the deactivation signal or on account of the deactivation signal.

The period of activity of the phase gating unit can be set by appropriate selection of the initialization value for example to the duration of precisely one half-cycle of the supply system frequency of the feeding supply system (the duration of only the first half-cycle of the supply system frequency after switch-on), to the duration of precisely one, two, three, four etc. full cycles of the supply system frequency of the feeding supply system, or to arbitrary intermediate values, for example to the duration of 0.5 full cycles, 0.6 full cycles, 1.25 full cycles etc. of the supply system frequency of the feeding supply system. For setting the period of activity of the phase gating unit in this way, an initialization value which corresponds to the desired period is ascertained and input on the basis of the supply system frequency and the counter clock frequency.

A counter is a particularly simple and efficient possible way of monitoring run-down of the respectively prespecified or prespecifiable activity period.

In a further embodiment of the motor starter proposed here or of a method for operating the motor starter, which embodiment also comes into consideration independently of the automatic deactivation of the phase gating unit after the activity period has elapsed and in this respect constitutes an advantageous embodiment, but equally also a separate aspect of at least one embodiment of the invention proposed here, provision is made—in summary—for the phase gating unit to dynamically change a phase gating angle and in so doing learn an expedient or optimum phase gating angle to a certain extent.

A motor starter with this function is intended and designed to record a current measurement value when the electric motor is switched on and during the switch-on process. Furthermore, the motor starter is intended and designed to change a phase gating angle which is used during operation of the phase gating unit depending on the recorded current measurement value and a prespecified or prespecifiable reference value. In a corresponding method for operating a motor starter of this kind, a phase gating angle which is used during operation of the phase gating unit is changed depending on a current measurement value, which is recorded when and after the motor is switched on, and a prespecified or prespecifiable reference value.

In a special embodiment of a method of this kind for learning an expedient or optimum phase gating angle or a motor starter which is intended and designed for executing a method of this kind, a maximum value of the current measurement value, which is recorded when and after the motor is switched on, is ascertained, and the phase gating angle is increased in size (increased) at a maximum value which exceeds the reference value. The period during which the current measurement value is recorded and the maximum value of the current is ascertained preferably corresponds to the activity period which is prespecified or prespecifiable for the activity of the phase gating unit. When learning of an expedient or optimum phase gating angle is implemented without activity of the phase gating unit in a manner dependent on time elapsing, an activity period of the detection of the current measurement value is prespecified—just like otherwise the activity period of the phase gating unit—and the current measurement value is detected and the maximum value is ascertained only during this activity period.

In this embodiment, it is ensured that adjusting the phase gating angle is not dependent on a current measurement value which may be recorded at an inexpedient time, but rather on the maximum value of the current flowing to the electric motor actually set during switch-on and immediately after switch-on. Adjusting the phase gating angle then precisely implements the reduction in this maximum value.

In a yet further embodiment of a method for learning an expedient or optimum phase gating angle, provision is made for the phase gating angle to be influenced by way of a controller which is comprised by the motor starter, in particular by its control unit. In a motor starter of this kind, a difference between the maximum value, which is ascertained on the basis of the current measurement value, and the reference value can be processed as a control deviation and as an input signal of the controller via the controller, and an actuating variable for influencing the phase gating angle can be output via the controller on the basis of the control deviation.

In a method which is executed by a motor starter of this kind during operation, a difference between the maximum value, which is ascertained on the basis of the current measurement value, and the reference value is processed as a control deviation and as an input signal of the controller via the controller, and an actuating variable for influencing the phase gating angle is output via the controller on the basis of the control deviation. The phase gating angle is then changed in accordance with the actuating variable. This embodiment allows very precise setting of the phase gating angle on account of the controller and the continuous or at least quasi-continuous change in the phase gating angle possible with the controller.

Use of a motor starter in accordance with the approach proposed here or operation of a motor starter according to the approach likewise proposed here is taken into consideration, for example, in a conveyor belt on which products which must not be excessively accelerated, that is to say must not fall over for example, are located. In general, the approach proposed here (motor starter and method for operating the motor starter) is taken into consideration in all applications which require problem-free operation of motors of energy efficiency class IE3 or IE4.

The illustration in FIG. 1 shows—in a schematically highly simplified manner—a low-power electric motor 12 which is fed (in two or three phases) by an electrical supply system 10. The electric motor 12 has, for example, a power of below 5.5 kW.

For soft start-up of the electric motor 12, a motor starter 14 which is known per se in principle for starting electric motors with a power starting from approximately 5.5 kW and is often referred to as a soft start-up device is connected upstream of the electric motor. The motor starter 14 comprises—in a manner which is likewise known per se in principle—a functional unit which is called a phase gating unit 20 for short here and which comprises thyristors or triacs which are connected back-to-back in parallel for phase gating for example for at least one phase.

The phase gating unit 20 is driven and/or monitored via at least one control unit 22 (phase gating control unit). The function of the phase gating unit 20 optionally comprises a function, which is known per se in principle, for varying the gating angle.

One aspect of embodiment of the invention proposed here is limiting the activity of the phase gating angle in respect of time by way of the phase gating unit 20. To this end, the control unit 22 prespecifies a period during which the phase gating unit 20 is active (activity period 32; FIG. 2) and implements phase gating. The control unit 22 activates the phase gating unit 20 when the motor 12 is switched on, monitors the period of activity of the phase gating unit 20 and automatically deactivates the phase gating unit 20 after the activity period 32 has elapsed. After deactivation of the phase gating unit 20, the electric motor 12 is fed with the voltage provided by the supply system 10 and the current provided by the supply system 10.

For deactivating the phase gating unit 20 in a manner dependent on time elapsing, the control unit 22 comprises, for example, a counter 24, which functions as a watchdog, or the like which is started when the motor 12 is switched on and implements deactivation of the phase gating unit 20 after the counter has run down. The counter 24 is either an upwardly counting counter 24 or a downwardly counting counter 24. In the case of an upwardly counting counter 24, the counter 24 is started when the motor 12 is switched on and deactivation of the phase gating unit 20 is performed when a prespecified or prespecifiable counter reading is reached. If the counter 24 is a downwardly counting counter 24, the counter 24 is initialized with a prespecified or prespecifiable value when the motor is switched on and deactivation of the phase gating unit 20 is performed when the counter reaches the value 0.

The text which follows is based on a downwardly counting counter 24—without sacrificing wider applicability. The same conditions apply correspondingly conversely for an upwardly counting counter 24. The downwardly counting counter 24 is initialized with the prespecified or prespecifiable value (initialization value 26) when the motor 12 is switched on and this value codes, together with a frequency (counter clock frequency) with which the counter 24 successively decrements the counter reading, a period (that is to say a time period) of the activity of the phase gating unit 20. The activity period 32 can be set in a manner which is known per se in principle by way of the initialization value 26 and/or the counter clock frequency. The period of activity of the phase gating unit 20 can therefore be parameterized in an optional manner during the course of setting the initialization value 26 and/or the counter clock frequency.

The illustration in FIG. 1 shows the ability to parameterize the counter 24 by way of a prespecifiable initialization value 26 in a schematically simplified manner. The initialization value 26 is impressed in a manner which is known per se on a memory cell of a memory, not shown, that is to say for example on a memory cell of the control unit 22, and is loaded in a manner which is likewise known per se from this memory cell during initialization of the counter 24. The contents of this memory cell are preferably preloaded with a standard value. Without prespecifying an initialization value 26, this standard value functions as an initialization value 26. In the event of parameterization of the counter 24, this standard value is overwritten by the initialization value 26.

The initialization value 26 can be input, for example, to the motor starter 14 or to the control unit 22 of the motor starter 14. In the case of a motor starter 14 which can be connected in terms of communication to other devices, for example a superordinate unit, the initialization value 26 can also be input to another device, for example the superordinate unit, and is transmitted from there in a wireless manner or via wires to the motor starter 14 or to the control unit 22. The connection in terms of communication may be, for example, a field bus or the like.

The period of activity of the phase gating unit 20 can be set by appropriate selection of the initialization value 26 for example to the duration of precisely one half-cycle of the supply system frequency of the feeding supply system 10 (the duration of only the first half-cycle of the supply system frequency after switch-on). The period of activity of the phase gating unit 20 can be set precisely to the duration of precisely one, two, three, four etc. full cycles of the supply system frequency of the feeding supply system 10. The period of activity of the phase gating unit 20 can likewise be set to arbitrary intermediate values, for example to the duration of 0.5 full cycles, 0.6 full cycles, 1.25 full cycles etc. of the supply system frequency of the feeding supply system 10. For setting the period of activity of the phase gating unit 20 in this way, an initialization value 26 which corresponds to the desired period is ascertained and input on the basis of the supply system frequency and the counter clock frequency.

The initialization value 26 is optionally the result of intermediate processing which is performed automatically (in the motor starter 14, in the control unit 22 or for example in the superordinate unit). The parameterization of the initialization value 26 is then possible indirectly by way of units which are more clearly understandable to a human operator. Selection of the number of full cycles of the supply system frequency of the feeding supply system 10 can then be performed (as an integer or as a rational number) for example, and input into an initialization value 26 for the counter 24 is implemented as part of the intermediate processing. In addition or as an alternative, parameterization of the initialization value 26 is optionally possible by prespecifying a duration in seconds, milliseconds or the like.

Input is implemented during the course of ascertaining the initialization value 26 by computer on the basis of the input and on the basis of the supply system frequency and the counter clock frequency. Ascertaining the respective initialization value 26 by computer then no longer has to be performed by the user and the user can use easily understandable variables, such as time or multiples (integer or rational) of half-cycles or full cycles of the supply system frequency, for prespecifying the initialization value 26, that is to say for specifying the period of activity of the phase gating unit 20.

In addition or as an alternative, the counter 24 can also be parameterized on the basis of a selection of prespecified categories which is made during the course of parameterization. Categories may be, for example, categories such as "off", "low", "medium" and "high". Each category is linked, for example via a lookup table or the like, with an initialization value 26 or indirectly with an initialization value 26, specifically for example a number (integer or rational) of the half-cycles or full cycles of the supply system frequency of the feeding supply system 10, and selection of a category directly or indirectly produces the respective initialization value 26.

Depending on the respectively set period, the control unit 22 automatically deactivates the phase gating unit 20 after the counter 24 has run down, that is to say when the counter has reached the counter reading 0 (zero) starting from the respective initialization value 26. This is shown in a schematically simplified manner in the illustration in FIG. 1 in the form of a deactivation signal 28 which is produced by the control unit 22 when the counter 24 has run down and is output to the phase gating unit 20.

The illustration in FIG. 2 shows the effect of time-limited activation of the phase gating unit 20 using the example of the current profile of a phase. The time in seconds ("[s]") is plotted on the abscissa. The current I in amperes ("[A]") is plotted on the ordinate. Recording the current profile 30 begins with switching on the motor 12, for example a motor 12 as shown in FIG. 1. The illustration in FIG. 3 shows the same conditions without phase gating, that is to say without activity of the phase gating unit 20, for comparison purposes.

The so-called inrush 34 (FIG. 3), that is to say a current peak, is produced in principle immediately after switch-on. On account of the activity of the phase gating unit 20, only a very short current peak is produced immediately after the motor 12 is switched on. The period of activity of the phase gating unit 20, the activity period 32, corresponds by way of example to the duration of a full cycle of the supply system frequency of the feeding supply system 10 in the situation shown.

After the motor 12 is switched on and the effects resulting in connection with switch-on which cause the increased inrush current, the drawn current drops in a manner which is known per se during start-up of the motor 12 and a resulting start-up phase 36 and finally feeding of the motor 12 with the rated current is established during an operating phase 38.

The illustration in FIG. 4 shows the control unit 22 with further details which are optional in principle. The control unit 22 then processes at least one current measurement value 40, specifically a current measurement value 40 which is recorded with reference to at least one phase which feeds the electric motor 12. When the motor 12 is switched on and immediately after the motor 12 is switched on, that is to say for example during the period of activity of the phase gating unit 20, a maximum value is ascertained on the basis of the current measurement value 40. This is compared with a prespecified or prespecifiable reference value 42 or a threshold value which results from the reference value 42. The reference value 42 is produced, for example, on the basis of values which are typical of the series (series of the respective motor 12). The threshold value used is, for example, a reference value which is reduced by 5%. When the threshold value or the reference value 42 exceeds the maximum value resulting during switch-on, the reduction in the inrush current achieved via the phase gating unit 20 is too low. The angle of phase gating is then changed in the direction of a reduction in the effective value of the current which is output to the motor (increase in the phase gating angle). If the maximum value resulting during switch-on does not reach the reference value 42, the angle of phase gating is changed in the direction of an increase in the effective value of the current which is output to the motor 12 (reduction in the phase gating angle).

Automatic adjustment of the phase gating angle in this way depending on a current measurement value 40 which is recorded when the motor 12 is switched on takes place, for example incrementally, in such a way that the phase gating angle is changed by a prespecified or prespecifiable increment each time the motor 12 is switched on, depending on whether the ascertained maximum value lies above or below the reference value 42. An expedient phase gating angle is finally established after several switch-on processes.

As an alternative, automatic adjustment of the phase gating angle in this way can also be realized depending on a current measurement value 40 which is recorded when the motor 12 is switched on via a controller 44, for example via a controller 44 which is implemented in the form of a proportional controller or a proportional-integral controller or the like. A respective difference between the maximum value which is ascertained when the motor 12 is switched on and the reference value 42 is then the control deviation which is processed by the controller 44, and the controller 44 generates the phase gating angle or an increment for changing the phase gating angle as an actuating variable 46 for the motor starter 14 and the motor 12 (section).

The phase gating angle is adjusted in this way in the case of an increase in the phase gating angle for ensuring sufficient limiting of the inrush current. In the event of a reduction in the phase gating angle, this takes place (with limiting of the inrush current) for reducing the thermal load owing to the phase gating.

Adjustment of the phase gating angle depending on a maximum value of a current measurement value 40 which is measured when the electric motor 12 is switched on can be called independent learning of an optimum or expedient phase gating angle (learning of the phase gating angle) for short and is a separate aspect of the invention proposed here. Learning the phase gating angle in this way can also be implemented independently of the deactivation of the phase gating unit 20 in a manner dependent on time elapsing, and implementation of learning the phase gating angle independently of the deactivation of the phase gating unit 20 in a manner dependent on time elapsing is to be considered to be covered by the description presented here and always inferred.

Instead of phase gating, phase gating can be performed—both in the phase gating unit 20 which is activated for a limited period and also when learning the phase gating angle—and in this respect phase chopping or phase gating and phase chopping can theoretically be added and inferred with respect to the description presented here each time phase gating is mentioned. Additional or alternative phase chopping is a further, optional aspect of the invention proposed here in any case.

Finally, the illustration in FIG. 5 shows—in a schematically highly simplified manner—an electric motor 12, specifically an electric motor 12 comprising a motor starter 14 according to FIG. 1 or FIG. 4. The electric motor 12 drives a transportation device 50 in a manner which is known per se in principle. The transportation device 50 is, for example, a conveyor belt or the like. Products 52, which should not fall over, are located on the transportation device 50 or on the conveyor belt. The products 52 are, for example, upright bottles or other containers. In order that the products 52 do not fall over during operation of the transportation device 50, the products 52 must be accelerated only to a limited extent when the transportation device 50 is started. This requires soft start-up of the electric motor 12. The soft start-up is ensured via a motor starter 14 according to the approach described here and by way of a method for operating the motor starter 14 likewise according to the approach described here by way of sharp acceleration of the transportation device 50 and the products 52 located on the transportation device being avoided when the electric motor 12 is started up. This is avoided by way of the phase gating unit 20 being at least briefly active when the electric motor 12 is started up and the phase gating unit preventing current and voltage peaks which otherwise result when the electric motor 12 is switched on.

Although the invention has been described and illustrated more specifically in detail by way of the example embodiment, the invention is not restricted by the disclosed example or examples and other variations can be derived therefrom by a person skilled in the art without departing from the scope of protection of the invention.

Individual aspects of the description presented here which are paramount can therefore be briefly summarized as follows: The invention specifies a motor starter 14 and a method for starting an electric motor 12. The motor starter 14 comprises a phase gating unit 20 and a control unit 22. The phase gating unit 20 can be deactivated via the control unit 22 after a prespecified or prespecifiable activity period 32 of the phase gating unit 20 has elapsed and is deactivated after the activity period 32 has elapsed during operation. The activity period 32 is comparatively short and a preferred activity period 32 corresponds, for example, to the provision of a half-cycle of the respective supply system frequency.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A motor starter for starting an electric motor, comprising:
   phase gating unit; and
   a control unit, to deactivate the phase gating unit after elapse of an activity period of the phase gating unit, the activity period being a pre-specified period during which the phase gating unit is active and after which the electric motor is fed with a voltage provided by a supply system and a current provided by the supply system, wherein
      the activity period of the phase gating unit corresponds to an integer or rational multiple of half-cycles or full cycles of a supply system frequency, and the activity period not exceeding a duration of four full cycles of the supply system frequency.

2. The motor starter of claim 1,
   wherein the control unit includes a counter,
   wherein the counter is initializable with an initialization value coding the activity period of the phase gating unit, and
   wherein the phase gating unit is deactivatable via, or on account of, a deactivation signal, the deactivation signal being generatable when the counter has run down.

3. The motor starter of claim 1, wherein a phase gating angle, usable during operation of the phase gating unit, is changable depending on a reference value and a current measurement value, the current measurement value being recorded when the motor is switched on.

4. The motor starter of claim 3,
   wherein a maximum value of the current measurement value, recorded when the motor is switched on, is ascertainable, and
   wherein the phase gating angle is increasable in size at a maximum value, the maximum value exceeding the reference value.

5. The motor starter of claim 4, further comprising
   a controller, wherein a difference between the maximum value, ascertainable based upon the current measurement value, and the reference value is processable as a control deviation and as an input signal of the controller via the controller, and
   wherein an actuating variable for influencing the phase gating angle is configured to be output via the controller, based upon the control deviation.

6. The motor starter of claim 2, wherein a phase gating angle, usable during operation of the phase gating unit, is changable depending on a reference value and a current measurement value, the current measurement value being recorded when the motor is switched on.

7. The motor starter of claim 6,
   wherein a maximum value of the current measurement value, recorded when the motor is switched on, is ascertainable, and
   wherein the phase gating angle is increasable in size at a maximum value, the maximum value exceeding the reference value.

8. The motor starter of claim 7, further comprising
   a controller, wherein a difference between the maximum value, ascertainable based upon the current measurement value, and the reference value is processable as a control deviation and as an input signal of the controller via the controller, and
   wherein an actuating variable for influencing the phase gating angle is configured to be output via the controller, based upon the control deviation.

9. A method for operating a motor starter including a phase gating unit and a control unit, the method comprising:
   deactivating, via the control unit, the phase gating unit after elapse of an activity period of the phase gating unit, the activity period being a pre-specified period during which the phase gating unit is active and after which a motor is fed with a voltage provided by a supply system and a current provided by the supply system, wherein
      the activity period of the phase gating unit corresponding to an integer or rational multiple of half-cycles or full cycles of a supply system frequency, and the activity period not exceeding a duration of four full-cycles of the supply system frequency.

10. The method of claim 9, wherein the control unit includes a counter and further comprising:
    initializing the counter with an initialization value which codes the activity period of the phase gating unit; and
    deactivating the phase gating unit, via a deactivation signal or on account of the deactivation signal, the deactivating signal being generated when the counter has run down.

11. The method of claim 9, further comprising:
    changing a phase gating angle, usable during operation of the phase gating unit, depending on a reference value and current measurement value, the current measurement value being recorded when the motor is switched on.

12. The method of claim 11, further comprising:
    ascertaining a maximum value of the current measurement value, recorded when the motor is switched on; and
    increasing the phase gating angle in size at a maximum value exceeding the reference value.

13. The method of claim 9, further comprising:
    processing, via a controller, a difference between a reference value and a maximum value, ascertained based upon a current measurement value, as a control deviation and as an input signal of the controller;
    outputting an actuating variable for influencing the phase gating angle via the controller, based upon the control deviation; and
    changing the phase gating angle in accordance with the actuating variable output.

14. The method of claim 10, further comprising:
    changing a phase gating angle, usable during operation of the phase gating unit, depending on a reference value and current measurement value, the current measurement value being recorded when the motor is switched on.

15. The method of claim 14, further comprising:
ascertaining a maximum value of the current measurement value, recorded when the motor is switched on; and
increasing the phase gating angle in size at a maximum value exceeding the reference value.

16. The method of claim 10, further comprising:
processing, via a controller, a difference between the reference value and a maximum value, ascertained based upon the current measurement value, as a control deviation and as an input signal of the controller;
outputting an actuating variable for influencing the phase gating angle via the controller, based upon the control deviation; and
changing the phase gating angle in accordance with the actuating variable output.

17. The method of claim 11, further comprising:
processing, via a controller, a difference between the reference value and a maximum value, ascertained based upon the current measurement value, as a control deviation and as an input signal of the controller;
outputting an actuating variable for influencing the phase gating angle via the controller, based upon the control deviation; and
changing the phase gating angle in accordance with the actuating variable output.

18. A system, comprising:
at least one transportation device, configured to be driven via an electric motor, the electric motor being configured to be switched on via a motor starter including phase gating unit, and
a control unit, to deactivate the phase gating unit after elapse of an activity period of the phase gating unit, the activity period being a pre-specified period during which the phase gating unit is active and implements phase gating, and after which the electric motor is fed with a voltage provided by a supply system and a current provided by the supply system, wherein
the activity period of the phase gating unit corresponding to an integer or rational multiple of half-cycles or full cycles of a supply system frequency, and the activity period not exceeding a duration of four full cycles of the supply system frequency.

19. The system of claim 18,
wherein the control unit includes a counter,
wherein the counter is initializable with an initialization value coding the activity period of the phase gating unit, and
wherein the phase gating unit is deactivatable via, or on account of, a deactivation signal, the deactivation signal being generatable when the counter has run down.

20. The system of claim 18, wherein a phase gating angle, usable during operation of the phase gating unit, is changable depending on a reference value and a current measurement value, the current measurement value being recorded when the motor is switched on.

* * * * *